(12) United States Patent
Lei et al.

(10) Patent No.: US 10,868,495 B2
(45) Date of Patent: Dec. 15, 2020

(54) AUTO-COMPENSATION FOR CONTROL VOLTAGE RANGE OF VCO AT LOW POWER SUPPLY

(71) Applicant: Lattice Semiconductor Corporation, Hillsboro, OR (US)

(72) Inventors: Kai Lei, Shanghai (CN); Shirley Li, Shanghai (CN); Oliver Wu, Shanghai (CN)

(73) Assignee: LATTICE SEMICONDUCTOR CORPORATION, Hillsboro, OR (US)

( * ) Notice: Subject to any disclaimer, the term of this patent is extended or adjusted under 35 U.S.C. 154(b) by 0 days.

(21) Appl. No.: 16/439,662

(22) Filed: Jun. 12, 2019

(65) Prior Publication Data
US 2019/0386612 A1 Dec. 19, 2019

(51) Int. Cl.
*H03B 5/04* (2006.01)
*H03B 5/24* (2006.01)
*H03L 7/183* (2006.01)
*H03L 7/099* (2006.01)

(52) U.S. Cl.
CPC .............. *H03B 5/04* (2013.01); *H03B 5/24* (2013.01); *H03L 7/0991* (2013.01); *H03L 7/183* (2013.01)

(58) Field of Classification Search
CPC ......................................................... H03B 5/04
USPC ............................................................ 331/15
See application file for complete search history.

(56) References Cited

U.S. PATENT DOCUMENTS

| | | | |
|---|---|---|---|
| 2011/0095831 A1* | 4/2011 | Weng ....................... | H03B 5/04 331/108 A |
| 2016/0248376 A1* | 8/2016 | Wu ........................... | H03B 5/04 |

* cited by examiner

*Primary Examiner* — Joseph Chang
(74) *Attorney, Agent, or Firm* — Haynes and Boone, LLP

(57) ABSTRACT

Some aspects of the present disclosure relate to an apparatus, a PLL and an electronic device. The apparatus comprises a voltage-to-current (V2I) converter, a current controlled oscillator and a compensation current. The V2I converter is operable to receive a first voltage and generate a first current based on the first voltage. The current controlled oscillator is coupled to the V2I converter and operable to generate an oscillation signal based on a second current from or to the V2I converter. The compensation circuit is coupled to the V2I converter and operable to receive a third current from or to the V2I converter. The second and third currents vary in response to at least one of temperature variation and supply voltage variation of the apparatus. Variation direction of the third current is opposite to variation direction of the second current and different frequencies may be provided for a low supply voltage domain.

20 Claims, 7 Drawing Sheets

AUTO-COMPENSATION FOR CONTROL VOLTAGE RANGE OF VCO AT LOW POWER SUPPLY

CROSS-REFERENCE TO RELATED APPLICATIONS

This application claims priority to and the benefit of Chinese Patent Application No. 201810610155.5 filed Jun. 13, 2018 which is hereby incorporated by reference in its entirety.

BACKGROUND

Field

Embodiments of the present disclosure generally relate to voltage controlled oscillator (VCO), and more specifically, to auto compensation for control voltage range of VCO at low supple voltage.

Related Art

Portable or wearable electronic devices are popular nowadays. In these electronic devices, phase locked loop (PLL) is normally the clock generation source, and VCO is the key module for the PLL. For VCOs in portable or wearable electronic devices, high frequency is less desired. Instead, low power consumption is more desired for longer stand-by time or battery life.

To pursue low power consumption, a low supply voltage, such as 1V, is often provided to VCOs. The VCOs provided with low supply voltage, however, encounter some issues, such as voltage headroom.

SUMMARY

Embodiments of the present disclosure provide an apparatus, a PPL and an electronic device. The apparatus comprises a voltage-to-current (V2I) converter, a current controlled oscillator and a compensation circuit. The V2I converter is operable to receive a first voltage and generate a first current based on the first voltage. The current controlled oscillator is coupled to the V2I converter and operable to generate an oscillation signal based on a second current from or to the V2I converter. The compensation circuit is coupled to the V2I converter and operable to receive a third current from or to the V2I converter. The second and third currents vary in response to at least one of temperature variation and supply voltage variation of the apparatus. Variation direction of the third current is opposite to variation direction of the second current.

It is to be understood that the summary is not intended to identify key or essential features of implementations of the present disclosure, nor is it intended to be used to limit the scope of the present disclosure. Other features of the present disclosure will become easily comprehensible through the description below.

BRIEF DESCRIPTION OF THE DRAWINGS

The above and other objectives, features and advantages of the present disclosure will become more apparent through more detailed depiction of example embodiments of the present disclosure in conjunction with the accompanying drawings, wherein in the example embodiments of the present disclosure, same reference numerals usually represent same components.

DETAILED DESCRIPTION

Hereinafter, the present disclosure will be discussed with reference to a plurality of embodiments. It should be understood that discussion of these embodiments is to enable a person of normal skill in the art to better understand and thereby implement the present disclosure, not implying any limitation to the scope of the present disclosure.

As used herein, the phrase "include(s)" and its variants shall be interpreted as an open term meaning "including but not limited to." The phrase "based on" shall be interpreted as "at least partially based on." The phrase "an embodiment" or "one embodiment" shall be interpreted as "at least one embodiment." The phrase "another embodiment" shall be interpreted as "at least one other embodiment." The phrases like "first" and "second" may refer to different or the same objects. The phrase "variation direction" shall be interpreted as direction of variation comprised of direction of increasing and direction of decreasing. Other definitions might also be included explicitly and implicitly in the following description.

Some values or value ranges might be described in the following. It is to be understood that these values and value ranges are only for the purpose of illustration, which may be advantageous to practice the idea of the present disclosure. However, depiction of these examples is not intended to limit the scope of the present disclosure in any manner. According to the specific application scenarios and needs, the values or value ranges may be set otherwise.

Also, some specific materials may be described by way of example. It is to be understood that these materials are only for the purpose of illustration, which may be advantageous to practice aspects of the present disclosure. However, depiction of these examples is not intended to limit the scope of the present disclosure in any manner. According to specific application scenarios and needs, the materials may be selected otherwise.

As mentioned above, VCOs are widely used in electronic systems. However, for low voltage and low power consumption electronic devices, voltage headroom is limited due to environment variation, such as temperature variation and/or unstable supply voltage.

Figure 1:
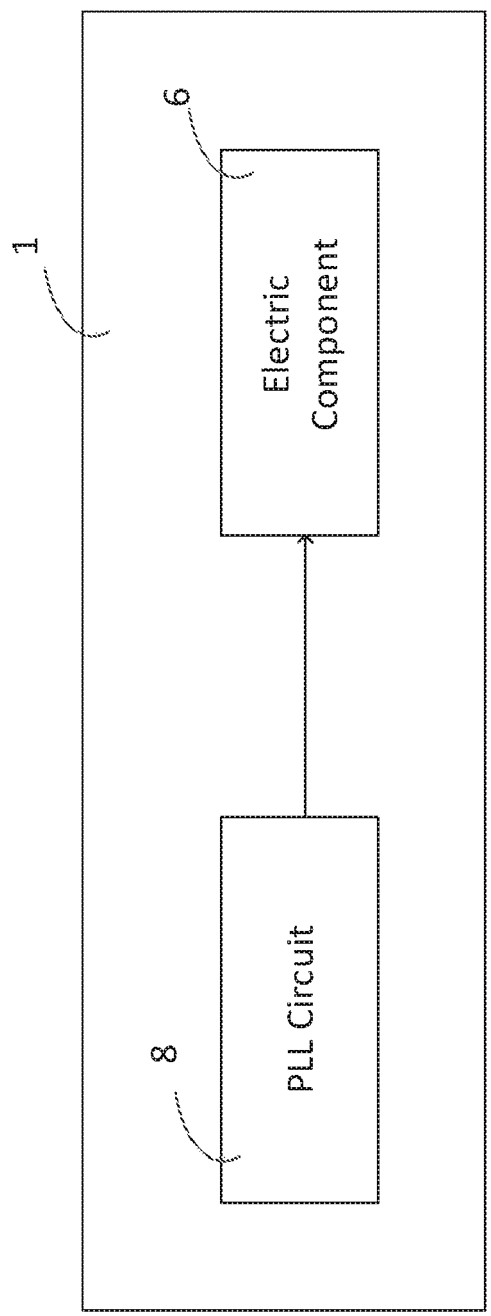
FIG. 1 illustrates environment of an exemplary electronic device.

FIG. 1 illustrates environment of an exemplary electronic device 1. For example, the electronic device 1 may be a wearable device, such as a smart watch or smart glasses. The electronic device 1 may include, among other things, a PLL circuit 8 and an electronic component 6. The electronic component 6 may be a processer, a digital signal processer (DSP), or a controller, and so on. The PLL circuit may include a VCO, and the PLL circuit is operable to provide a clock signal to the electronic component 6.

Figure 2:
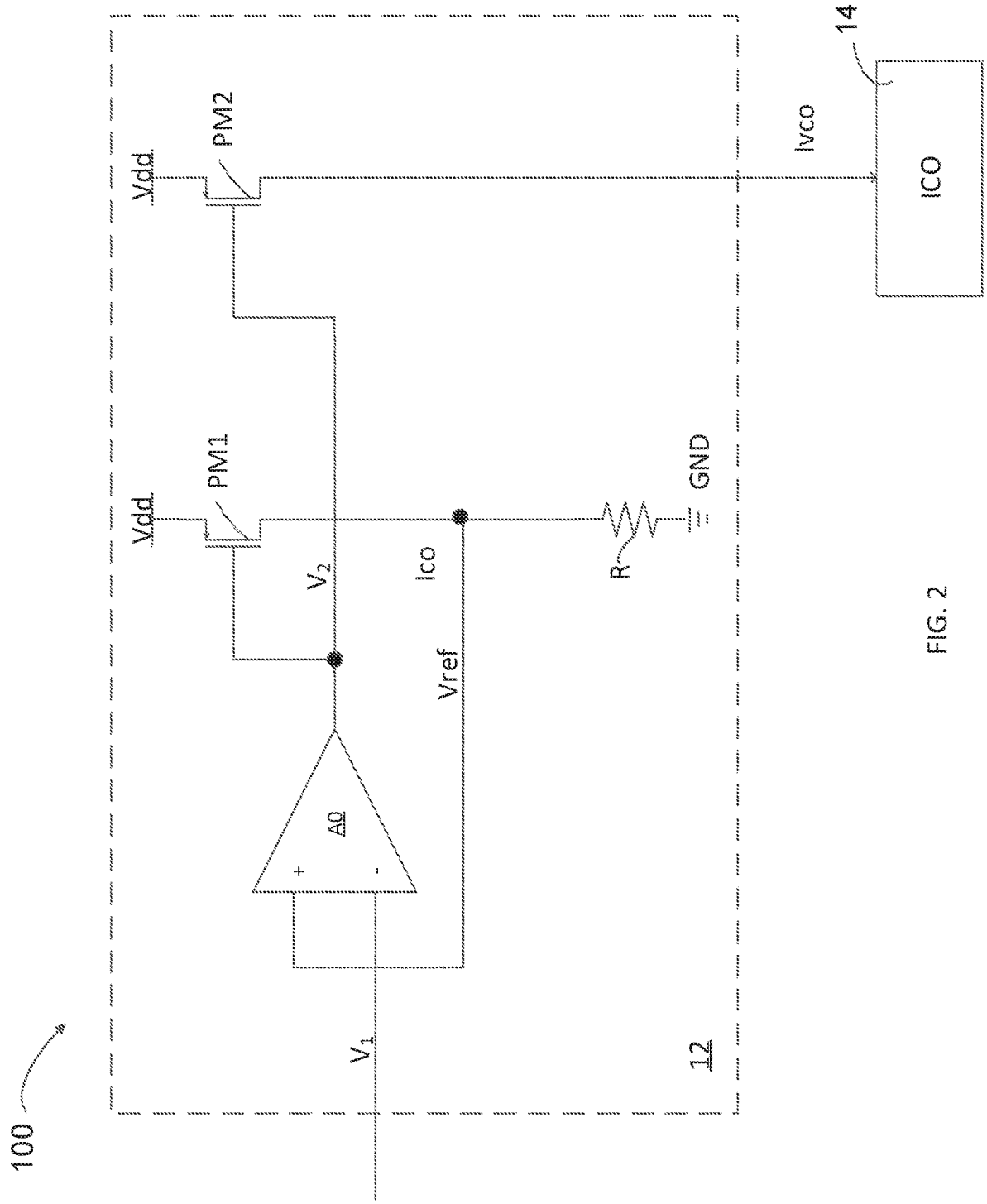
FIG. 2 illustrates a schematic of a conventional VCO.

FIG. 2 illustrates a schematic of a conventional VCO 100 in a wearable device. The conventional VCO 100 includes a V2I converter 12 and a current controlled oscillator (ICO) 14. The V2I converter 12 includes an operational amplifier A0, a first PMOS transistor PM1, a second PMOS transistor PM2, a resistor R. The V2I converter 12 is operable to receive a control voltage $V_1$ and generate a current signal Ivco based on the control voltage $V_1$. Specifically, the operational amplifier A0 is operable to compare the input voltage $V_1$ and the reference voltage Vref, and generate a second voltage $V_2$ based on the comparison. The second voltage $V_2$ is provided to the gates of the PMOS transistors PM1 and PM2. The PMOS transistors PM1 and PM2 generate, in response to receiving $V_2$, currents Ico and Ivco, respectively. The current Ico flows to the resistor, and no current flows from the PMOS transistor PM1 to the operational amplifier A0. Thus, the reference voltage Vref equals to a production of the current Ico and the resistance of the resistor R.

In the schematic of FIG. 2, the supply voltage Vdd may be set to equal to or less than 1V. This supply voltage is significantly lower than the supply voltages (for example 3.6V) in other electronic devices. Although the supply voltage is low, threshold voltages, such as threshold voltages of PMOS transistors PM1 and PM2, do not decrease accordingly. Also, process-voltage-temperature (PVT) of the VCO 100 may vary. Thus, voltage headroom may be squeezed due to the PVT variation, and larger voltage range may be desired for the first voltage $V_1$. This is critical especially in low supply voltage of below 1V. The current signal Ico from the PMOS transistor PM1 may be represented by the following equation (1).

$$I_{co} = \frac{1}{2} * \mu * c_{ox} * \frac{w}{l} * (Vdd - V_2 - |V_{th}|)^2 \quad (1)$$

in which, µ represents carrier mobility of the PMOS transistor PM1, $C_{ox}$ represents capacitance of gate oxide per unit area of the PMOS transistor PM1, w represents gate width of the PMOS transistor PM1, l represents gate length of the PMOS transistor PM1, Vth represents threshold voltage of the PMOS transistor PM1.

The PMOS transistor PM1 and the PMOS transistor PM2 constitute a current mirror. Thus, the current Ivco from the PMOS transistor PM2 may be represented by the following equation (2).

$$I_{vco} = N * I_{co} \quad (2)$$

in which, N represents current amplification, and depends on device dimensions, such as gate width.

In case that the items µ, $C_{ox}$, w, l, Vth for the PMOS transistor PM2 is the same as those for the PMOS transistor PM1, the above equation (2) may be rewritten into equation (3).

$$I_{vco} = \frac{1}{2} * \mu * c_{ox} * \frac{w}{l} * N * (Vdd - V_2 - |V_{th}|)^2 \quad (3)$$

In case that the VCO is under high temperature or the supply voltage Vdd increases, the threshold voltage Vth decreases. However, the second voltage $V_2$ will increase more as compare to the increment of supply voltage Vdd and the reduction of the threshold voltage Vth. As a result, the current Ivco decreases under high temperature or the supply voltage Vdd according to the equation (3).

In case that the VCO is under low temperature or the supply voltage Vdd decreases, the threshold voltage Vth increases. However, the second voltage $V_2$ will decrease more as compare to the reduction of supply voltage Vdd and the increment of the threshold voltage Vth. As a result, the current Ivco increases under low temperature or the supply voltage Vdd according to the equation (3).

The first voltage $V_1$ is provided by the previous stage, such as from a charge pump. The first voltage $V_1$ can be determined from the following equation (4).

$$V_1 = V_{ref} = I_{co} * R = I_{vco} * \frac{R}{N} \quad (4)$$

Since N is substantially constant, variation of the first voltage $V_1$ depends from variations of the resistance R and the current Ivco. The parameter like "N" may refer to a predetermined number hereinafter. As stated above, in case that the VCO is under high temperature or the supply voltage Vdd increases, the current Ivco decreases. Thus, the first voltage decreases accordingly. In case that the VCO is under low temperature or the supply voltage Vdd decreases, the current Ivco increases. Thus, the first voltage increases accordingly. In some cases, the current Ivco (L) under low temperature or low supply voltage Vdd may be twice the current Ivco (H) under high temperature or high supply voltage Vdd. For example, simulation shows that the current Ivco (L) could be around 2 mA, and the current Ivco (H) could be around 1 mA.

Moreover, the resistance R may vary under different temperature. In some cases, the resistance R may vary by 20%. This may cause the first voltage $V_1$ to vary more. For example, the resistance R (L) under low temperature or low supply voltage Vdd may be 1.5 times the resistance R (H) under high temperature or high supply voltage Vdd. Taking the variation factors of the current Ivco and the resistance R into consideration, the first voltage $V_1$ (L) under low temperature or low supply voltage Vdd may be three times the first voltage $V_1$ (H) under high temperature or high supply voltage Vdd, as shown in the following equation (5).

$$\frac{V_1(L)}{V_1(H)} = \frac{Ivco(L)}{Ivco(H)} * \frac{R(L)}{R(H)} = 2 * \frac{1.2}{0.8} = 3 \quad (5)$$

In an example, the low power supply Vdd may be 0.8V, and the first voltage $V_1$ (H) may be 200 mV. In this case, the first voltage $V_1$ (L) needs to be limited within 600 mV to keep the upstream charge pump mismatch within an acceptable range. Also, it can be seen that in this case, more than one frequency point cannot be possible for wearable device having a maximum supply voltage of 1V.

Figure 3:
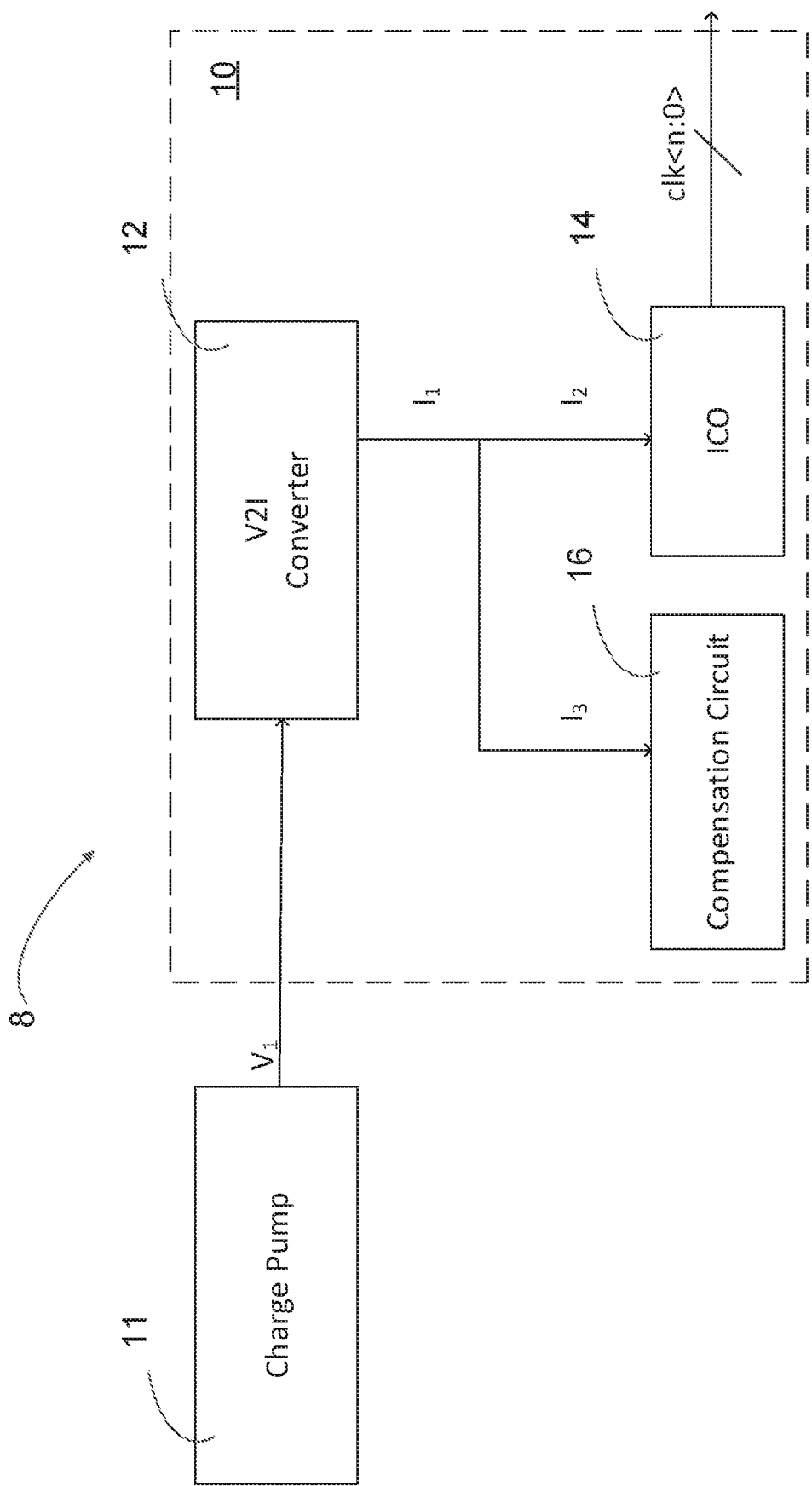
FIG. 3 illustrates a block diagram of a PLL according to an embodiment of the present disclosure.

FIG. 3 illustrates a block diagram of a PLL circuit 8 according to an embodiment of the present disclosure. The PLL circuit 8 includes, among other things, a charge pump 11 and a VCO 10. The VCO 10 includes a V2I converter 12, an ICO 14 and a compensation circuit 13. The charge pump provides a first voltage $V_1$ to the V2I converter 12. The V2I converter 12 converts the first voltage $V_1$ to a first current signal $I_1$. The ICO 14 receives a second current $I_2$ from the V2I 12, and the compensation circuit 16 receives a third current $I_3$ from the V2I 12. The ICO 14 generates clocks <n:0> for downstream components in the PLL circuit 8 based on the second current $I_2$. Examples of the VCO 10 may be found in FIGS. 4-6, and the VCO 20 can also be applied to the block diagram of FIG. 3.

Figure 4:
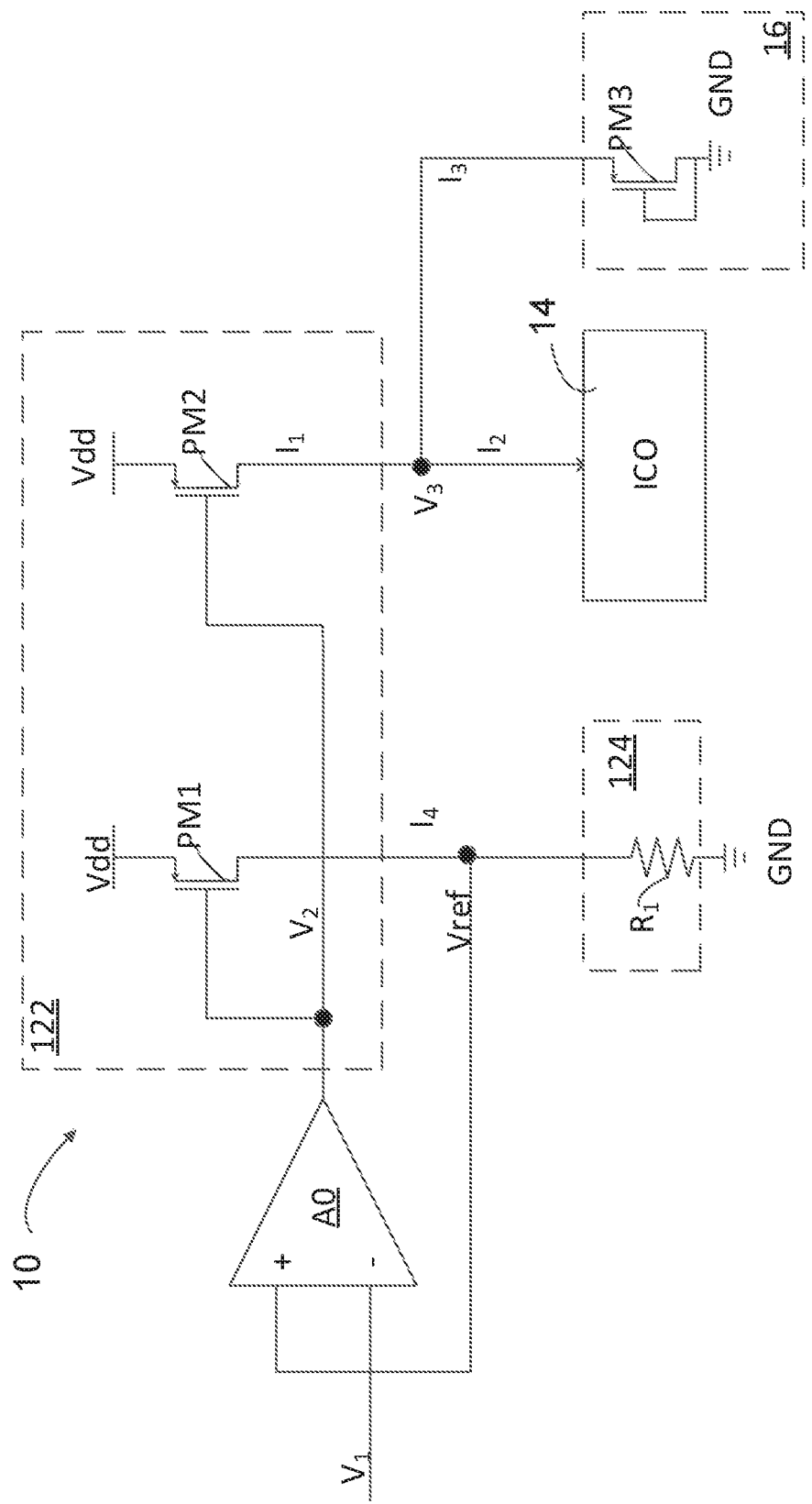
FIG. 4 illustrates an exemplary schematic of the VCO of FIG. 3.

FIG. 4 illustrates an exemplary schematic of the VCO 10 of FIG. 3. The VCO 10 includes an operational amplifier A0, a current mirror 122, a reference voltage generator 124, an ICO 14 and a compensation circuit 16. The operational amplifier A0 is operable to compare the input voltage $V_1$ and the reference voltage Vref, and generate a second voltage $V_2$ based on the comparison. The second voltage $V_2$ is provided to the current mirror 122. The current mirror 122 provides a fourth current $I_4$ and a first current $I_1$. The fourth current $I_4$ is proportional to the first current $I_1$. The reference voltage generator 124 provides a reference voltage Vref to the operational amplifier A0 based on the fourth current $I_4$.

In the schematic circuit of FIG. 4, the reference generator 124 includes a resistor $R_1$ coupled between the current mirror 122 and the ground GND. Although the embodiments of the present disclosure are described with reference to the reference generator 124, this is merely for illustration without suggesting any limitations as to the scope of the present disclosure. In alternative embodiments, the reference generator 124 may include a MOS transistor or a bipolar transistor.

In the schematic of FIG. 4, the current mirror 122 may include a pair of PMOS transistors PM1 and PM2 coupled in parallel. The PMOS transistors PM1 and PM2 may be produced with a same process technology. The gates of PMOS transistors PM1 and PM2 receive the second voltage $V_2$ respectively. Upon receiving the second voltage $V_2$, the PMOS transistors PM1 and PM2 may be turned on, such that the fourth current $I_4$ and the first current $I_1$ may flow through the PMOS transistors PM1 and PM2 respectively. As described above, the fourth current $I_4$ may be proportional to the first current $I_1$. The proportion depends on several factors including device dimensions. Generally, PMOS transistors PM1 and PM2 may share a same gate length. In this case, the proportion may depend on gate widths of the PMOS transistors PM1 and PM2.

For example, assuming that the ratio of the first current $I_1$ to the fourth current $I_4$ is N, the ratio of the gate width of the PMOS transistor PM2 to the gate width of the PMOS transistor PM1 needs to be N so as to maintain the current ratio N. In another example, the PMOS transistor PM2 may include N PMOS transistors coupled to each other in parallel. Each PMOS transistor of the N PMOS transistor may have a gate width same as the gate width of the PMOS transistor PM1. Although the embodiments of the present disclosure are described with reference to the current mirror 122, this is merely for illustration without suggesting any limitations as to the scope of the present disclosure. In alternative embodiments, the current mirror 122 may include NMOS transistors, as show in FIG. 7. Although a specific configuration of the current mirror 122 is shown in FIG. 4, other configurations for current mirror 122 can be applied.

In the schematic of FIG. 4, the compensation circuit 16 may include a PMOS transistor PM3. The PMOS transistor PM3 is coupled between the current mirror 122 and the ground GND, and the gate of the PMOS transistor PM3 is coupled to the ground GND. The compensation circuit 16 is operable to receive a third current $I_3$ from the current mirror 122. The first current $I_1$ may split into the second and third currents $I_2$ and $I_3$, or equals to the sum of the second and third currents $I_2$ and $I_3$.

Since the first voltage $V_1$ equals to the reference voltage Vref, and the reference voltage Vref equals to a production of the fourth current $I_4$ and the resistance of the resistor $R_1$, a relatively stable fourth current $I_4$ would be beneficial. The four current $I_4$ may depend on the second voltage $V_2$ applied to the gate of the PMOS transistor PM1. According to physic model of the PMOS transistor PM1, the second voltage $V_2$ may be represented by the following equation (6).

$$V_2 = Vdd - |V_{th}| - \sqrt{\frac{2*I_4*l}{\mu*c_{ox}*w}} \tag{6}$$

in which, $\mu$ represents carrier mobility of the PMOS transistor PM1, $C_{ox}$ represents capacitance of gate oxide per unit area of the PMOS transistor PM1, w represents gate width of the PMOS transistor PM1, l represents gate length of the PMOS transistor PM1, Vth represents threshold voltage of the PMOS transistor PM1.

According to the equation (2), the second voltage $V_2$ at the gates of the PMOS transistors PM1 and PM2 may be rewritten into equation (7).

$$V_2 = Vdd - |V_{th}| - \sqrt{\frac{2*(I_2+I_3)*l}{\mu*c_{ox}*w*N}} \tag{7}$$

According to the equation (7), a relatively stable second voltage $V_2$ can be achieved in case that variation direction of the second current $I_2$ is opposite to the variation direction of the third current $I_3$. With a relatively stable second voltage $V_2$, a relatively stable current $I_4$ may flow through the first PMOS transistor PM1, and the first voltage $V_1$ may thus be represented by the following equation (8).

$$V_1 = V_{ref} = I_4*R_1 = \frac{I_1}{N}*R_1 = (I_2+I_3)*\frac{R_1}{N} \tag{8}$$

As stated above, the third current $I_3$ may vary in a direction opposite to variation of the second current $I_2$ and/or the first resistor $R_1$. Thus, a relatively stable first voltage $V_1$ across various conditions can be achieved.

Under high temperature or high supply voltage, the second current $I_2$ and the resistance of the first resistor $R_1$ may decrease. In order to achieve a relatively stable $V_1$, the third current $I_3$ needs to increase. The third current $I_3$ may be represented below by the equation (9).

$$I_3 = \frac{1}{2}*\mu*c_{ox}*\frac{w}{l}*(V_3-|v_{th}|)^2 \tag{9}$$

in which, $\mu$ represents carrier mobility of the PMOS transistor PM3, $C_{ox}$ represents capacitance of gate oxide per unit area of the PMOS transistor PM3, w represents gate width of the PMOS transistor PM3, l represents gate length of the PMOS transistor PM3, and Vth represents threshold voltage of the PMOS transistor PM3.

In case of high temperature and/or high supply voltage Vdd, the voltage $V_3$ increases as the supply voltage Vdd increases, and Vth of the PMOS PM3 decrease, such that the third current $I_3$ increases accordingly, as apparent in the equation (9). According to the equation (8), since the second current $I_2$ and the resistance of the resistor $R_1$ decreases and the third current $I_3$ increases under a condition of high temperature and/or high supply voltage, the first voltage $V_1$ becomes relatively stable.

In addition, in case of high temperature and/or high supply voltage Vdd, the PMOS transistor PM3 tends to operate in a saturation region, and the threshold voltage Vth becomes very low. This would further increase the third current $I_3$, as apparent in the equation (9).

In case of low temperature and/or low supply voltage Vdd, the voltage $V_3$ decreases as the supply voltage Vdd decreases, and Vth of the PMOS PM3 increase, such that the third current $I_3$ decreases accordingly, as apparent in the equation (9). According to the equation (8), since the second current $I_2$ and the resistance of the resistor $R_1$ increases and the third current $I_3$ decreases under a condition of low temperature and/or low supply voltage, the first voltage $V_1$ also becomes relatively stable.

In addition, in case of low temperature and/or low supply voltage Vdd, the PMOS transistor PM3 tends to operate in the sub-threshold region. The PMOS transistor PM3 operating in the sub-threshold region usually consumes little current, as compared to the saturation region. Thus, the MOS transistor PM3 operating in the sub-threshold region leads to a lower power consumption.

In response to at least one of temperature variation and supply voltage Vdd, variation direction of the third current $I_3$ is opposite to variation direction of the second current $I_2$, leading to a relatively stable first current $I_1$, and a relatively stable fourth current $I_4$ for current mirroring. The relatively stable fourth current $I_4$ causes a relatively stable reference voltage Vref, and a relatively stable first voltage $V_1$. As a result, the first voltage $V_1$ is relatively stable no matter how the environment, such as temperature or supply voltage, varies.

For example, simulation shows that the second and third currents $I_2$ and 13 under high temperature or high supply voltage could be around 1 mA and 0.2 mA respectively, and the second and third currents $I_2$ and $I_3$ under low temperature or high supply voltage could be around 2 mA and 0.1 mA respectively. Based on the equation (6), the ratio can be rewritten as below into equation (10).

$$\frac{V_1(L)}{V_1(H)} = \frac{I_2(L)+I_3(L)}{I_2(H)+I_3(H)} * \frac{R(L)}{R(H)} = \frac{(2+0.1)}{(1+0.2)} * \frac{1.2}{0.8} = 2.625 \quad (10)$$

As compared to the equation (6) for conventional VCO without compensation circuit 16, the equation (10) shows that the first voltage variation across various temperatures or under various supply voltages can be reduced (2.625<3). For example, 300 mV-800 mV is enough for a first voltage $V_1$, and this voltage range may be used to generate a second current (e.g., 10 mA) to the ICO 14 for generating a clock of first frequency, e.g., 1600 MHz. 100 mV-300 mV is enough for another first voltage $V_1$, and this voltage range may be used to generate another second current (e.g., 2 mA) to the ICO 14 for generating a clock of second frequency, e.g., 800 MHz. In other words, the current controlled oscillator is operable to generate oscillation signals of different frequencies based on the second current $I_2$ of different values. It can be understood that variation of the second current $I_2$ in response to the variation of temperature and/or supply voltage would not constitute the second current $I_2$ of different values.

Thus, more than one frequency points are feasible for low supply voltage environment, since variation range for the first voltage $V_1$ is reduced, and more ranges for different frequency points can be accommodated in a low voltage domain.

Figure 5:
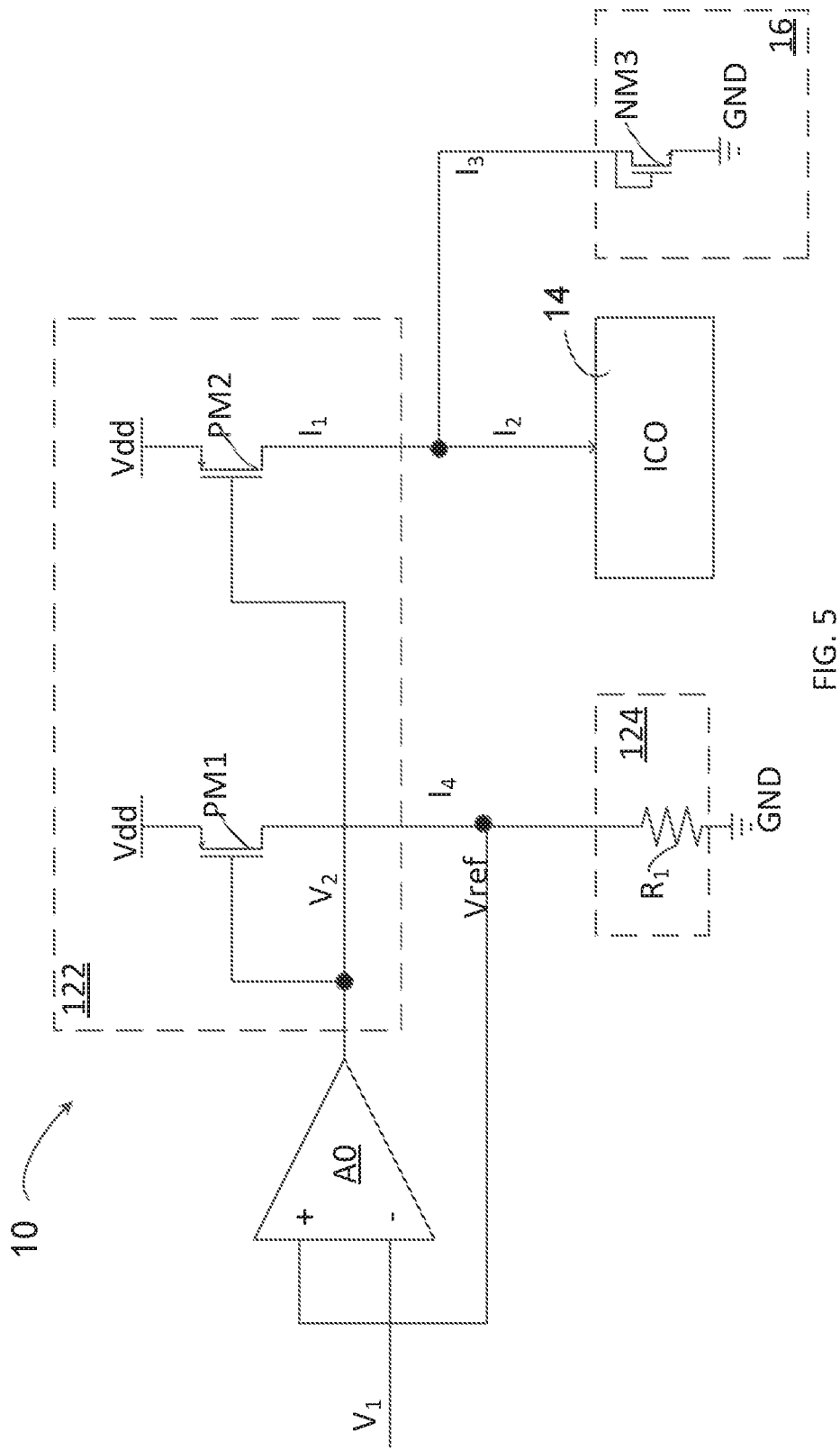
FIG. 5 illustrates another exemplary schematic of the VCO of FIG. 3.

FIG. 5 illustrates another exemplary schematic of the VCO of FIG. 3. The schematic of FIG. 5 is similar to the schematic of FIG. 4. Thus, explanation for similar components is omitted here. The difference is the configuration of the compensation circuit 16. In FIG. 5, a NMOS transistor NM3 is adopted, instead of the PMOS transistor PM3. The NMOS transistor NM3 is coupled between the current mirror 122 and the ground GND. The gate of the NMOS transistor NM3 is coupled to its drain and the current mirror 122. The equation (9) for the third current $I_3$ also applies to the third current $I_3$ flowing through the NMOS transistor NM3. In this case, the variation direction of the third current $I_3$ is also opposite to the variation direction of the second current $I_2$. The schematic can also achieve an effect of relatively stable first voltage across various temperatures or under various supply voltages. Thus, more than one frequency points are feasible for low supply voltage environment, since variation range for the first voltage $V_1$ is reduced, and more ranges for different frequency points can be accommodated in a low voltage domain.

Figure 6:
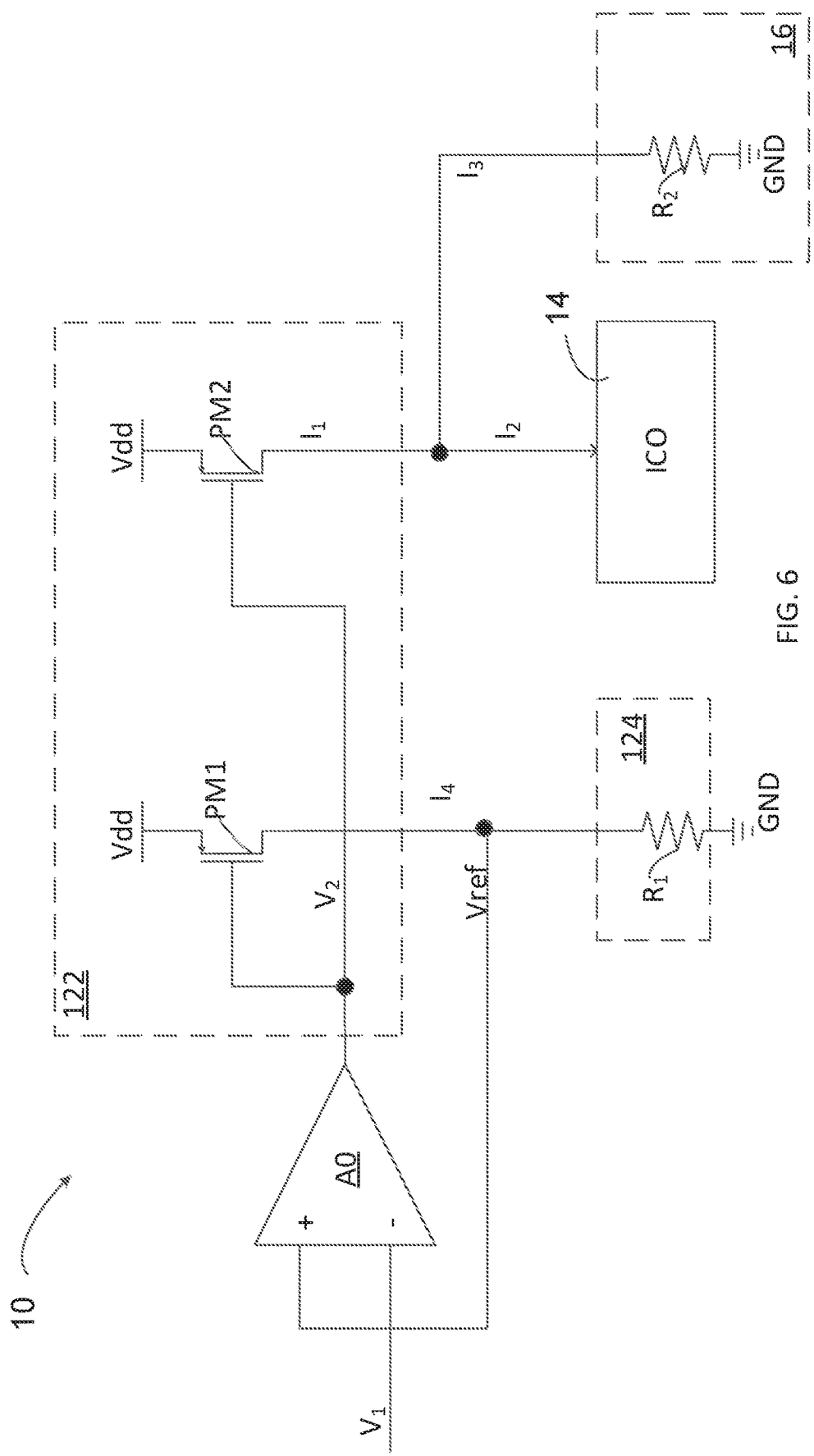
FIG. 6 illustrates a further exemplary schematic of the VCO of FIG. 3.

FIG. 6 illustrates a further exemplary schematic of the VCO of FIG. 3. The schematic of FIG. 6 is similar to the schematic of FIG. 4. Thus, explanation for similar components is omitted here. The difference is the configuration of the compensation circuit 16. In FIG. 6, a second resistor $R_2$ is adopted, instead of the PMOS transistor PM3. The second resistor $R_2$ is coupled between the current mirror 122 and the ground GND. The resistance of the second resistor $R_2$ may vary in different conditions. Specifically, in case of high temperature, the resistance of the second resistor $R_2$ may decrease, as discussed above with reference to the first resistor $R_1$, such that the third current $I_3$ may increase accordingly. Also, in case of low temperature, the resistance of the second resistor $R_2$ may increase, as discussed above with reference to the first resistor $R_1$, such that the third current $I_3$ may decrease accordingly. As a result, the variation direction of the third current $I_3$ is also opposite to the variation direction of the second current $I_2$. The schematic can also achieve an effect of relatively stable first voltage across various temperatures or under various supply voltages. Thus, more than one frequency points are feasible for low supply voltage environment, since variation range for the first voltage $V_1$ is reduced, and more ranges for different frequency points can be accommodated in a low voltage domain.

Figure 7:
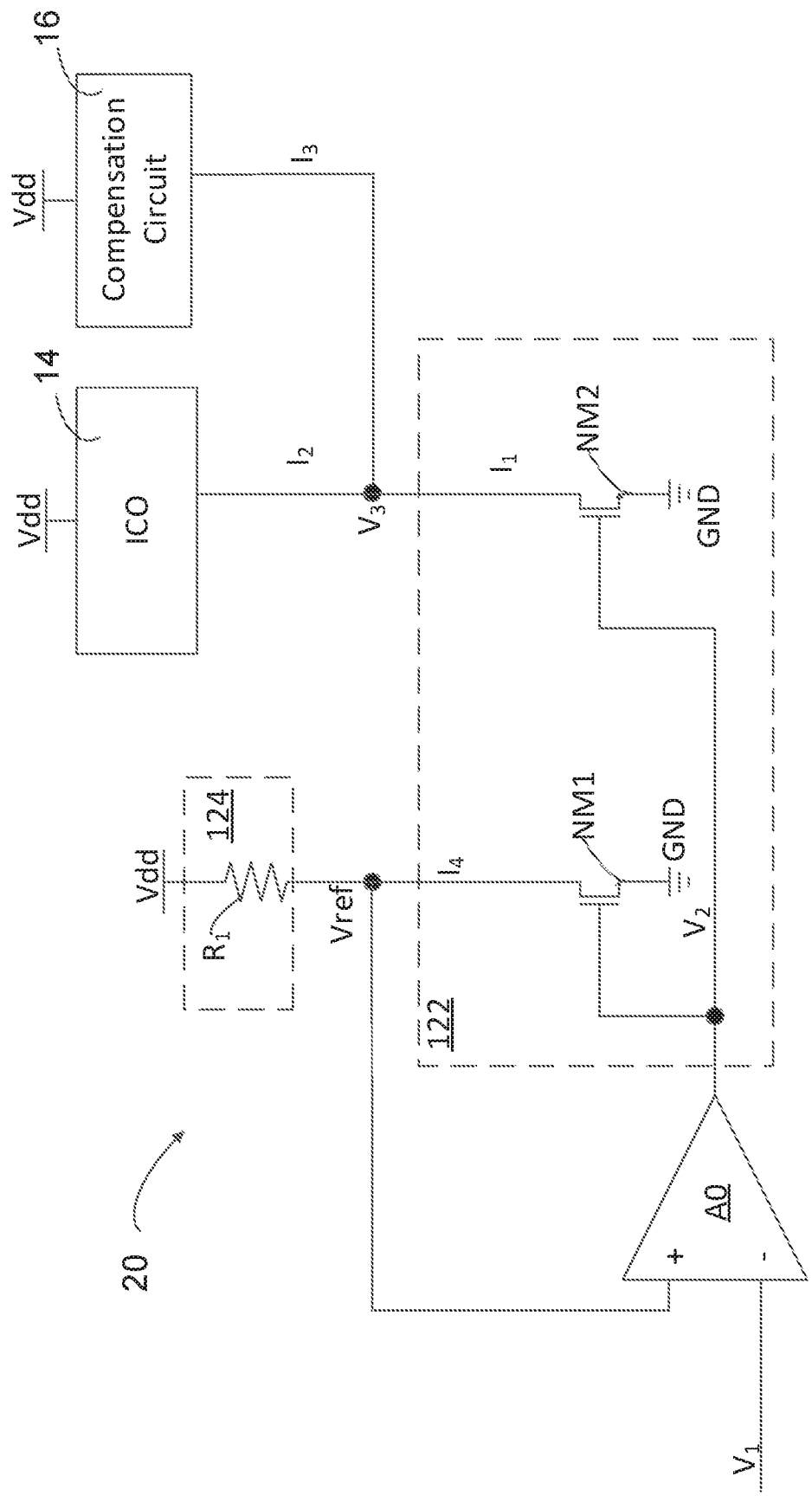
FIG. 7 illustrates an exemplary schematic of a VCO according to another embodiment of the present disclosure.

FIG. 7 illustrates an exemplary schematic of a VCO 20 according to another embodiment of the present disclosure. The schematic of the VCO 20 is built on a NMOS-based structure.

The VCO 20 includes an operational amplifier A0, a current mirror 122, a reference voltage generator 124, an ICO 14 and a compensation circuit 16. The operational amplifier A0 is operable to compare the input voltage $V_1$ and the reference voltage Vref, and generate a second voltage $V_2$ based on the comparison. The second voltage $V_2$ is provided to the current mirror 122. The current mirror 122 provides a fourth current $I_4$ and a first current $I_1$. The fourth current $I_4$ is proportional to the first current $I_1$. The reference voltage generator 124 provides a reference voltage Vref to the operational amplifier A0 based on the fourth current $I_4$.

In the schematic of FIG. 7, the reference generator 124 includes a resistor $R_1$ coupled between the current mirror 122 and the supply voltage Vdd. Although the embodiments of the present disclosure are described with reference to the reference generator 124, this is merely for illustration without suggesting any limitations as to the scope of the present disclosure. In alternative embodiments, the reference generator 124 may include a MOS transistor or a bipolar transistor.

In the schematic of FIG. 7, the current mirror 122 may include a pair of NMOS transistors NM1 and NM2 coupled in parallel. The NMOS transistors NM1 and NM2 may be produced with a same process technology. The gates of NMOS transistors NM1 and NM2 receive the second voltage $V_2$ respectively. Upon receiving the second voltage $V_2$, the NMOS transistors NM1 and NM2 may be turned on, such that the fourth current $I_4$ and the first current $I_1$ may flow through the NMOS transistors NM1 and NM2 respectively. As described above, the fourth current $I_4$ may be proportional to the first current $I_1$. The proportion depends on several factors including device dimensions. Generally, NMOS transistors NM1 and NM2 may share a same gate length. In this case, the proportion may depend on gate widths of the NMOS transistors NM1 and NM2.

For example, assuming that the ratio of the first current $I_1$ to the fourth current $I_4$ is N, the ratio of the gate width of the NMOS transistor NM2 to the gate width of the NMOS transistor NM1 needs to be N so as to maintain the current ratio N. In another example, the NMOS transistor NM2 may include N NMOS transistors coupled to each other in parallel. Each NMOS transistor of the N NMOS transistor may have a gate width same as the gate width of the NMOS transistor NM1. Although the embodiments of the present disclosure are described with reference to the current mirror 122, this is merely for illustration without suggesting any limitations as to the scope of the present disclosure. In alternative embodiments, the current mirror 122 may include PMOS transistors, as show in FIG. 4. Although a specific configuration of the current mirror 122 is shown in FIG. 7, other configurations for current mirror 122 can be applied.

In the schematic of FIG. 7, the compensation circuit 16 may include a NMOS transistor NM3 of FIG. 5 coupled between the supply voltage Vdd and the current mirror 122, or the PMOS transistor PM3 of FIG. 4, or the second resistor $R_2$ of FIG. 6. The compensation circuit 16 is operable to deliver a third current $I_3$ to the current mirror 122. The first current $I_1$ may merge from the second and third currents $I_2$ and $I_3$, or equals to the sum of the second and third currents $I_2$ and $I_3$. In the schematic configuration of FIG. 7, the fourth current $I_4$ may be represented by the following equation (11).

$$I_4 = \frac{1}{2} * \mu * C_{ox} * \frac{w}{l} * (V_2 - |V_{th}|)^2 \quad (11)$$

$\mu$ represents carrier mobility of the NMOS transistor NM1, $C_{ox}$ represents capacitance of gate oxide per unit area of the NMOS transistor NM1, w represents gate width of the NMOS transistor NM1, 1 represents gate length of the NMOS transistor NM1, Vth represents threshold voltage of the NMOS transistor NM1.

The NMOS transistor NM1 and the NMOS transistor NM2 constitute a current mirror. Thus, the current $I_1$ from the NMOS transistor NM2 may be represented by the following equation (12).

$$I_1 = N * I_4 \quad (12)$$

in which, N represents current amplification, and depends on device dimensions, such as gate width.

In case that the items $\mu$, $C_{ox}$, w, 1, Vth for the NMOS transistor NM2 is the same as those for the NMOS transistor NM1, the above equation (12) may be rewritten into equation (13).

$$I_1 = I_2 + I_3 = \frac{1}{2} * \mu * C_{ox} * N * \frac{w}{l} * (V_2 - |V_{th}|)^2 \quad (13)$$

The above equation (13) may be rewritten into equation (14) as below.

$$V_2 = |Vth| + \sqrt{\frac{2*(I_2 + I_3)*l}{\mu * C_{ox} * w * N}} \quad (14)$$

$\mu$ represents carrier mobility of the NMOS transistor NM1, $C_{ox}$ represents capacitance of gate oxide per unit area of the NMOS transistor NM1, w represents gate width of the NMOS transistor NM1, 1 represents gate length of the NMOS transistor NM1, Vth represents threshold voltage of the NMOS transistor NM1.

According to the equation (14), a relatively stable second voltage $V_2$ can be achieved in case that variation direction of the second current $I_2$ is opposite to the variation direction of the third current $I_3$. With a relatively stable second voltage $V_2$, a relatively stable current $I_4$ may flow through the first PMOS transistor PM1, and the first voltage $V_1$ may thus be represented by the following equation (15).

$$V_1 = V_{ref} = Vdd - I_4 * R_1 = Vdd - \frac{I_1}{N} * R_1 = Vdd - (I_2 + I_3) * \frac{R_1}{N} \quad (15)$$

As stated above, the third current $I_3$ may vary in a direction opposite to variation of the second current $I_2$ and/or the first resistor $R_1$. Thus, a relatively stable first voltage $V_1$ across various conditions can be achieved.

Under high temperature or high supply voltage, the second current $I_2$ and the resistance of the first resistor $R_1$ may decrease. In order to achieve a relatively stable $V_1$, the third current $I_3$ needs to increase in this condition. Assuming that the compensation circuit 16 is a PMOS transistor PM3 of FIG. 4, the third current $I_3$ may be represented below by the equation (16).

$$I_3 = \frac{1}{2} * \mu * C_{ox} * \frac{w}{l} * (Vdd - V_3 - |v_{th}|)^2 \quad (16)$$

in which, $\mu$ represents carrier mobility of the PMOS transistor PM3, $C_{ox}$ represents capacitance of gate oxide per unit area of the PMOS transistor PM3, w represents gate width of the PMOS transistor PM3, 1 represents gate length of the PMOS transistor PM3, and Vth represents threshold voltage of the PMOS transistor PM3.

In case of high temperature and/or high supply voltage Vdd, the voltage $V_3$ increases as the supply voltage Vdd increases, and Vth of the PMOS PM3 decrease, such that the third current $I_3$ increases accordingly, as apparent in the equation (16). Since the second current $I_2$ and the resistance of the resistor $R_1$ decreases and the third current $I_3$ increases under a condition of high temperature and/or high supply voltage, the first voltage $V_1$ becomes relatively stable.

In addition, in case of high temperature and/or high supply voltage Vdd, the PMOS transistor PM3 tends to operate in a saturation region, and the threshold voltage Vth becomes very low. This would further increase the third current $I_3$, as apparent in the equation (15).

In case of low temperature and/or low supply voltage Vdd, the voltage $V_3$ decreases as the supply voltage Vdd decreases, and Vth of the PMOS PM3 increase, such that the third current $I_3$ decreases accordingly, as apparent in the equation (15). Since the second current $I_2$ and the resistance of the resistor $R_1$ increases and the third current $I_3$ decreases under a condition of low temperature and/or low supply voltage, the first voltage $V_1$ also becomes relatively stable.

In addition, in case of low temperature and/or low supply voltage Vdd, the PMOS transistor PM3 tends to operate in the sub-threshold region. The PMOS transistor PM3 operating in the sub-threshold region usually consumes little current, as compared to the saturation region. Thus, the MOS transistor PM3 operating in the sub-threshold region leads to a lower power consumption.

In response to at least one of temperature variation and supply voltage Vdd, variation direction of the third current $I_3$ is opposite to variation direction of the second current $I_2$, leading to a relatively stable first current $I_1$, and a relatively stable fourth current $I_4$ for current mirroring. The relatively stable fourth current $I_4$ causes a relatively stable reference voltage Vref, and a relatively stable first voltage $V_1$. As a result, the first voltage $V_1$ is relatively stable no matter how the environment, such as temperature or supply voltage, varies.

Hereinafter, some example implementations of the present disclosure will be listed.

In some embodiments, an apparatus is provided that comprises a voltage-to-current converter, a current controlled oscillator and a compensation circuit. The voltage-to-current converter is operable to receive a first voltage and generate a first current based on the first voltage. The current controlled oscillator is coupled to the V2I converter, and operable to generate an oscillation signal based on a second current from or to the V2I converter. The compensation circuit is coupled to the V2I converter, and operable to receive a third current from or to the V2I converter. The first current includes a combination of the second and third currents. The second and third currents vary in response to at least one of temperature variation and supply voltage variation of the apparatus. Variation direction of the third current is opposite to variation direction of the second current.

In some embodiments, the V2I converter comprises an operational amplifier, a current mirror and a reference voltage generator. The operational amplifier is operable to receive the first voltage and a reference voltage, and generate a second voltage in response to comparison of the first voltage and the reference voltage. The current mirror is coupled to the operational amplifier, and operable to receive the second voltage and generate the first current and a fourth current. The first current is a predetermined number of times of the fourth current, and the predetermined number being equal to or greater than 1. The reference voltage generator is coupled to the current mirror and the operational amplifier, and operable to generate the reference voltage based on the fourth current.

In some embodiments, the reference voltage generator includes a first resistor or a transistor.

In some embodiments, the current mirror comprises: a first transistor unit and a second transistor unit. The first transistor unit is coupled to the reference voltage generator, and operable to generate the fourth current in response to the second voltage being applied to a control terminal of the first transistor unit. The second transistor unit is coupled to the current controlled oscillator, and operable to generate the first current in response to the second voltage being applied to a control terminal of the second transistor unit.

In some embodiments, the first transistor unit includes a first PMOS transistor coupled between the supply voltage and the reference voltage generator. The second transistor unit includes a second PMOS transistor coupled between the supply voltage and the current controlled oscillator. Gate width of the second PMOS transistor is the predetermined number of times of gate width of the first PMOS transistor.

In some embodiments, the first transistor unit includes a PMOS transistor coupled between the supply voltage and the reference voltage generator. The second transistor unit includes the predetermined number of second PMOS transistors coupled in parallel between the supply voltage and the current controlled oscillator. Gate width of each of the predetermined number of second transistor equals to gate width of the first PMOS transistor.

In some embodiments, the first transistor unit includes a first NMOS transistor coupled between the ground and the reference voltage generator. The second transistor unit includes a second NMOS transistor coupled between the ground and the current controlled oscillator. Gate width of the second NMOS transistor is N times of gate width of the first transistor.

In some embodiments, the first transistor unit includes a first NMOS transistor coupled between the ground and the reference voltage generator. The second transistor unit includes the predetermined number of second NMOS transistors coupled in parallel between the ground and the current controlled oscillator. Gate width of each of the predetermined number of second NMOS transistors equals to gate width of the first NMOS transistor.

In some embodiments, the compensation circuit comprises a third PMOS transistor coupled between the current mirror and the ground, a gate of the PMOS transistor being coupled to the ground.

In some embodiments, the compensation circuit comprises a third NMOS transistor coupled between the current mirror and the ground, a gate of the NMOS transistor being coupled to the current mirror.

In some embodiments, the compensation circuit comprises a second resistor, resistance of the second resistor decreases in response to at least one of increasing temperature and increasing supply voltage of the apparatus, and the resistance of the second resistor increases in response to at least one of decreasing temperature and decreasing supply voltage of the apparatus.

In some embodiments, the supply voltage is below 1V.

In some embodiments, the current controlled oscillator is further operable to generate oscillation signals of different frequencies based on the second current of different values.

In some embodiments, a phase locked loop circuit is provided that comprises: a charge pump generating a first voltage and a voltage controlled oscillator. The voltage controlled oscillator is coupled to the charge pump, and includes a voltage-to-current converter, a current controlled oscillator and a compensation circuit. The voltage-to-current converter is operable to receive the first voltage and generate a first current based on the first voltage. The current controlled oscillator is coupled to the V2I converter, and operable to generate an oscillation signal based on a second current from or to the V2I converter. The compensation circuit is coupled to the V2I converter and operable to receive a third current from or to the V2I converter. The first current includes a combination of the second and third currents. The second and third currents vary in response to at least one of temperature variation and supply voltage variation of the apparatus. Variation direction of the third current is opposite to variation direction of the second current.

In some embodiments, the V2I converter comprises: an operational amplifier, a current mirror and a reference voltage generator. The operational amplifier is operable to receive the first voltage and a reference voltage, and generate a second voltage in response to comparison of the first voltage and the reference voltage. The current mirror is coupled to the operational amplifier, and operable to receive the second voltage and generate the first current and a fourth current. The first current being a predetermined number of times of the fourth current. The predetermined number is equal to or greater than 1. The reference voltage generator is coupled to the current mirror and the operational amplifier, and operable to generate the reference voltage based on the fourth current.

In some embodiments, the reference voltage generator comprises a first resistor or a transistor.

In some embodiments, the current mirror comprises: a first transistor unit and a second transistor unit. The first transistor unit is coupled to the reference voltage generator, and operable to generate the fourth current in response to the second voltage being applied to a control terminal of the first transistor unit. The second transistor unit is coupled to the current controlled oscillator, and operable to generate the first current in response to the second voltage being applied to a control terminal of the second transistor unit.

In some embodiments, the compensation circuit comprises a third PMOS transistor coupled between the current mirror and the ground, a gate of the PMOS transistor being coupled to the ground.

In some embodiments, the compensation circuit comprises a third NMOS transistor coupled between the current mirror and the ground, a gate of the NMOS transistor being coupled to the current mirror.

In some embodiments, it is provided an electronic device that comprises a phase locked loop circuit and an electric component coupled to the PLL circuit to operate based on the oscillation signal. The phase locked loop circuit includes a charge pump generating a first voltage and a voltage controlled oscillator coupled to the charge pump. The voltage controlled oscillator includes a voltage-to-current converter, a current controlled oscillator and a compensation circuit. The voltage-to-current converter is operable to receive the first voltage and generate a first current based on the first voltage. The current controlled oscillator is coupled to the V2I converter and operable to generate an oscillation signal based on a second current from or to the V2I converter. The compensation circuit is coupled to the V2I converter and operable to receive a third current from or to the V2I converter. The first current includes a combination of the second and third currents. The second and third currents vary in response to at least one of temperature variation and supply voltage variation of the apparatus. Variation direction of the third current is opposite to variation direction of the second current.

Various embodiments of the present disclosure have been described above. The illustrations above are only for illustration without suggesting any limitations as to scope of the present disclosure. Without departing from the scope and spirit of various embodiments as illustrated, many modifications and changes are obvious to those skilled in the art. Selection of the terms used herein is intended to best explain the principle of respective embodiments, actual application, or improvement of technologies in the market, or enable other person of normal skill in the art to understand the embodiments disclosed herein. Reference numbers present in the claims, if any, are provided solely as an aid to understanding example structures or acts within the scope of a given claim element, and are not limiting as to the scope of the claim or elements thereof.

We claim:

1. An apparatus, comprising:
a voltage-to-current (V2I) converter operable to receive a first voltage (V1) and generate a first current (I1) based on the first voltage (V1);
a current controlled oscillator coupled to the V2I converter, and operable to generate an oscillation signal based on a second current (I2) from or to the V2I converter; and
a compensation circuit coupled to the V2I converter, and operable to receive a third current (I3) from or to the V2I converter, wherein the first current (I1) includes a combination of the second and third currents (I2, I3), the second and third currents (I2, I3) vary in response to temperature variation and/or supply voltage (Vdd) variation of the apparatus, and variation direction of the third current (I3) is opposite to variation direction of the second current (I2).

2. The apparatus of claim 1, wherein the V2I converter comprises:
an operational amplifier (A0) operable to receive the first voltage and a reference voltage, and generate a second voltage (V2) in response to comparison of the first voltage (V1) and the reference voltage (Vref);
a current mirror coupled to the operational amplifier (A0), and operable to receive the second voltage (V2) and generate the first current (I1) and a fourth current (I4), the first current (I1) being a predetermined number of times of the fourth current (I4), and the predetermined number being equal to or greater than 1; and
a reference voltage generator coupled to the current mirror and the operational amplifier (A0), and operable to generate the reference voltage (Vref) based on the fourth current (I4), wherein the reference voltage generator includes a first resistor (R1) or a transistor.

3. The apparatus of claim 2, wherein the current mirror comprises:
a first transistor unit (PM1, NM1) coupled to the reference voltage generator, and operable to generate the fourth current (I4) in response to the second voltage (V2) being applied to a control terminal of the first transistor unit (PM1, NM1); and
a second transistor unit (PM2, NM2) coupled to the current controlled oscillator, and operable to generate the first current (I1) in response to the second voltage (V2) being applied to a control terminal of the second transistor unit (PM2, NM2).

4. The apparatus of claim 3, wherein
the first transistor unit (PM1, NM1) includes a first PMOS transistor (PM1) coupled between the supply voltage (Vdd) and the reference voltage generator,
the second transistor unit (PM2, NM2) includes a second PMOS transistor (PM2) coupled between the supply voltage (Vdd) and the current controlled oscillator, gate width of the second PMOS transistor (PM2) is the predetermined number of times of gate width of the first PMOS transistor (PM1), and the supply voltage (Vdd) is below 1 V.

5. The apparatus of claim 3, wherein the first transistor unit (PM1, NM1) includes a PMOS transistor (PM1) coupled between the supply voltage (Vdd) and the reference voltage generator, the second transistor unit (PM2, NM2) includes the predetermined number of second PMOS transistors coupled in parallel between the supply voltage (Vdd) and the current controlled oscillator, and gate width of each of the predetermined number of second transistor (PM2) equals to gate width of the first PMOS transistor (PM1).

6. The apparatus of claim 3, wherein the first transistor unit (PM1, NM1) includes a first NMOS transistor (NM1) coupled between the ground (GND) and the reference voltage generator, the second transistor unit (PM2, NM2) includes a second NMOS transistor (NM2) coupled between the ground (GND) and the current controlled oscillator, and gate width of the second NMOS transistor (NM2) is the predetermined number of times of gate width of the first transistor (NM1).

7. The apparatus of claim 3, wherein the first transistor unit (PM1, NM1) includes a first NMOS transistor coupled between the ground (GND) and the reference voltage generator, the second transistor unit (PM2, NM2) includes the predetermined number of second NMOS transistors (NM2) coupled in parallel between the ground (GND) and the current controlled oscillator, and gate width of each of the predetermined number of second NMOS transistors (NM2) equals to gate width of the first NMOS transistor (NM1).

8. The apparatus of claim 1, wherein the compensation circuit comprises a third PMOS transistor (PM3) coupled between a current mirror and the ground (GND), a gate of the third PMOS transistor (PM3) being coupled to the ground (GND).

9. The apparatus of claim 1, wherein the compensation circuit comprises a third NMOS transistor (NM3) coupled between a current mirror and the ground (GND), a gate of the third NMOS transistor (NM3) being coupled to the current mirror.

10. The apparatus of claim 1, wherein the compensation circuit comprises a second resistor (R2), resistance of the second resistor (R2) decreases in response to increasing temperature and/or increasing supply voltage (Vdd) of the apparatus, and the resistance of the second resistor (R2) increases in response to decreasing temperature and/or decreasing supply voltage (Vdd) of the apparatus, and wherein the current controlled oscillator is further operable to generate oscillation signals of different frequencies based on the second current (I2) of different values.

11. The apparatus of claim 1, wherein the compensation circuit comprises a transistor configured to selectively operate in a saturation region or a sub-threshold region based on a temperature and/or a supply voltage.

12. The apparatus of claim 1, wherein:
the compensation circuit comprises a transistor;
the supply voltage variation comprises a decrease in a supply voltage; and
in response to the decrease in the supply voltage, the third current decreases, the second current increases, and a threshold voltage of the transistor increases.

13. The apparatus of claim 2, wherein:
the reference voltage generator comprises the first resistor;
the temperature variation comprises an increase in a temperature; and
in response to the increase in the temperature, a resistance of the first resistor decreases, the second current decreases, and the third current increases.

14. A phase locked loop (PLL) circuit, comprising:
a charge pump generating a first voltage (V1); and
a voltage controlled oscillator coupled to the charge pump and including:
a voltage-to-current (V2I) converter operable to receive the first voltage (V1) and generate a first current (I1) based on the first voltage (V1);
a current controlled oscillator coupled to the V2I converter, and operable to generate an oscillation signal based on a second current (I2) from or to the V2I converter; and
a compensation circuit coupled to the V2I converter and operable to receive a third current (I3) from or to the V2I converter, wherein the first current (I1) includes a combination of the second and third currents (I2, I3), the second and third currents (I2, I3) vary in response to temperature variation and/or supply voltage (Vdd) variation of the apparatus, and variation direction of the third current (I3) is opposite to variation direction of the second current (I2).

15. The circuit of claim 14, wherein the V2I converter comprises:
an operational amplifier (A0) operable to receive the first voltage (I1) and a reference voltage, and generate a second voltage (V2) in response to comparison of the first voltage (V1) and the reference voltage (Vref);
a current mirror coupled to the operational amplifier (A0), and operable to receive the second voltage (V2) and generate the first current (I1) and a fourth current (I4), the first current (I1) being a predetermined number of times of the fourth current (I4), and the predetermined number being equal to or greater than 1; and
a reference voltage generator coupled to the current mirror and the operational amplifier (A0), and operable to generate the reference voltage (Vref) based on the fourth current (I4).

16. The circuit of claim 15, wherein the reference voltage generator comprises a first resistor (R1) or a transistor.

17. The circuit of claim 15, wherein the current mirror comprises:
a first transistor unit (PM1, NM1) coupled to the reference voltage generator, and operable to generate the fourth current (I4) in response to the second voltage (V2) being applied to a control terminal of the first transistor unit (PM1, NM1); and
a second transistor unit (PM2, NM2) coupled to the current controlled oscillator, and operable to generate the first current (I1) in response to the second voltage (V2) being applied to a control terminal of the second transistor unit (PM2, NM2).

18. The circuit of claim 14, wherein the compensation circuit comprises a third PMOS transistor (PM3) coupled between a current mirror and the ground (GND), a gate of the third PMOS transistor (PM3) being coupled to the ground (GND).

19. The circuit of claim 14, wherein the compensation circuit comprises a third NMOS transistor (NM3) coupled between a current mirror and the ground (GND), a gate of the third NMOS transistor (NM3) being coupled to the current mirror.

20. An electronic device, comprising:
   a phase locked loop (PLL) circuit including:
      a charge pump generating a first voltage (V1); and
      a voltage controlled oscillator coupled to the charge pump and including:
         a voltage-to-current (V2I) converter operable to receive the first voltage (V1) and generate a first current (I1) based on the first voltage (V1);
         a current controlled oscillator coupled to the V2I converter and operable to generate an oscillation signal based on a second current (I2) from or to the V2I converter; and
         a compensation circuit coupled to the V2I converter and operable to receive a third current (I3) from or to the V2I converter, wherein the first current (I1) includes a combination of the second and third currents (I2, I3), the second and third currents (I2, I3) vary in response to at least one of temperature variation and/or supply voltage (Vdd) variation of the apparatus, and variation direction of the third current (I3) is opposite to variation direction of the second current (I2); and
   an electric component, coupled to the PLL circuit to operate based on the oscillation signal.

* * * * *